United States Patent [19]

Arbib et al.

[11] E Re. 30,696

[45] Reissued Aug. 4, 1981

[54] SOLDERING FLUX COMPOSITION

[75] Inventors: Gordon F. Arbib; Wallace Rubin, both of Hemel Hempstead, England

[73] Assignee: Multicore Solders Limited, Hertfordshire, England

[21] Appl. No.: 150,945

[22] Filed: May 19, 1980

Related U.S. Patent Documents

Reissue of:

[64] Patent No.: 4,092,182
Issued: May 30, 1978
Appl. No.: 795,635
Filed: May 10, 1977

[30] Foreign Application Priority Data

Jun. 11, 1976 [GB] United Kingdom ..... 24410/76

[51] Int. Cl.[3] ..... B23K 35/34
[52] U.S. Cl. ..... 148/23
[58] Field of Search ..... 148/23–25

[56] References Cited

U.S. PATENT DOCUMENTS

| | | | |
|---|---|---|---|
| 2,700,628 | 1/1955 | DeRosa | 148/23 |
| 2,829,998 | 4/1958 | Glynn | 148/23 |
| 3,235,414 | 2/1966 | Marks | 148/23 |
| 3,301,688 | 1/1967 | Simpelaar | 148/23 |
| 3,675,307 | 7/1972 | Strauss | 148/23 |
| 3,975,216 | 8/1976 | Stayner | 148/23 |

FOREIGN PATENT DOCUMENTS

| | | | |
|---|---|---|---|
| 152769 | 6/1974 | Czechoslovakia | 148/23 |
| 1337347 | 11/1973 | United Kingdom | 148/23 |

*Primary Examiner*—P. D. Rosenberg
*Attorney, Agent, or Firm*—Browdy and Neimark

[57] ABSTRACT

A flux composition of the non-corrosive type suitable for use in soft soldering, particularly in the electrical and electronics industries, contains in place of the conventional natural rosin (colophony), an ester of a polyhydric alcohol such as pentaerythritol tetrabenzoate. The composition can be in solid or liquid form and in the latter can perform the multiple functions of an etch resist, a protective coating and a flux in the production of printed circuit assemblies.

13 Claims, No Drawings

SOLDERING FLUX COMPOSITION

Matter enclosed in heavy brackets [ ] appears in the original patent but forms no part of this reissue specification; matter printed in italics indicates the additions made by reissue.

The present invention relates to soft soldering and is concerned with a novel composition of matter for use in soft soldering, particularly, but not exclusively, in the electrical and electronics industries.

Soldering with a soft solder, i.e., a tin-lead based alloy melting at below about 400° C., is widely employed in the electrical and electronics industries, for example in the assembly of printed circuits, electronic components and conductors. In order to produce a satisfactory soldered joint, it is necessary to use a flux with the soft solder in order to remove any residual surface oxide films and hence provide a clean surface and in order to reduce the surface tension of the molten solder and hence promote good wetting of the surface by the solder. Fluxes for soft soldering can be classified as corrosive intermediate, or non-corrosive. It is normally essential in the electronics industry to use a flux which is non-corrosive, i.e., a flux which after use in a soldering operation yields a residue which is substantially inert and hence will not appreciably corrode the soldered joint particularly under humid conditions. Non-corrosive fluxes are conventionally natural rosin-based fluxes comprising wood rosin or gum rosin. Rosin (also known as colophony) principally comprises a mixture of rosin acids the major component of which is abietic acid. The rosin flux may contain a small amount of an additive, generally known as an activating agent, which will improve the fluxing action of the rosin. Such rosin fluxes may be incorporated as a core or cores in solder wires, or may be used in the form of solutions or pastes.

A disadvantage which has been encountered in the use of rosin fluxes for soft soldering, particularly in the electronics industry where numerous joints have to be soldered in quick succession, is that unpleasant fumes can be evolved when heat is applied to the rosin flux.

We have found that a composition containing an ester of a polyhydric alcohol, particularly higher molecular weight esters, may be used as a flux material for soft soldering and that such ester-based compositions exhibit a lower degree of fuming than the conventional rosin-based fluxes when used under similar conditions. These ester-based compositions may also have other technical advantages over conventional rosin-based fluxes, such as forming transparent residues so making it easier to inspect the soldered joints, forming flexible residues which improve the vibration resistance of the soldered joints, and possessing high temperature resistance. They may also be less acidic than rosin and hence even less likely to cause corrosion of soldered joints.

Thus, in accordance with one aspect of the present invention, there is provided a composition suitable for use as a flux in soft soldering, comprising as an essential constituent (1) at least one ester of a polyhydric alcohol. [The simplest of such esters has a molecular weight of about 90.]

The composition will also comprise as an essential constituent (2) at least one additional constituent selected from:

(a) organic acids which are substantially soluble in the said ester of a polyhydric alcohol when in a molten condition;

(b) flux activating agents; and (c) flux residue hardening agents.

The ester of a polyhydric alcohol must be present in the composition in an amount of at least 25% by weight, based on the total weight of constituents (1) and (2).

The ester, which [preferably has] *should have* a molecular weight of at least 300 and advantageously in the range from 300 to 3000 and is solid at room temperature, may be one formed by the reaction of a polyhydric alcohol, for example, diethylene glycol, neopentyl glycol, glycerol, triethylene glycol, dipropylene glycol, trimethylolethane, trimethylolpropane, pentaerythritol, di-pentaerythritol, sorbitol, mannitol, inositol, or sucrose, with an organic [mono- or poly-carboxylic] *monocarboxylic* acid. Suitable acids may be chosen from saturated *fatty* acids, for example acetic acid or [fatty acids, such as] stearic acid, from unsaturated fatty acids, for example, oleic acid, or from *mononuclear* aromatic [or cyclic carboxylic] acids, for example benzoic acid[, abietic acid or modified abietic acids]. Esters which have been found to be particularly suitable are those derived from polyhydric alcohols containing from 2 to 8, preferably 3 to 6, hydroxyl groups, for example pentaerythritol tetraacetate, pentaerythritol tetrastearate, pentaerythritol tetraoleate, pentaerythritol tetrabenzoate, mannitol hexa-acetate, triethylene glycol dibenzoate, glyceryl tribenzoate, neopentyl glycol dibenzoate, trimethylolethane tribenzoate and sucrose octa-acetate.

The organic acid (a) which may be incorporated in the flux composition as an auxiliary fluxing agent to impart sufficient acidity to enable the ester to function as a flux may be an aliphatic or aromatic mono- or polycarboxylic acid, for example stearic acid, adipic acid, sebacic acid, linoleic acid, benzoic acid or salicylic acid. The amount of organic acid present in the flux composition will be at least sufficient to enable the ester to function as a flux and generally this amount will be such as to impart to the ester a fluxing ability equivalent to rosin. The amount of organic acid present will not normally exceed 20% by weight of the total composition.

The flux composition may contain a flux activating agent (b) to improve the fluxing activity (i.e. speed of fluxing) of the ester. Such activating agents may be chosen from organic acids such as those referred to above, sulphonic acids, for example dinonyl naphthalene sulphonic acid, and aliphatic and aromatic amines and hydrohalides thereof, for example glycine, octadecylamine, nicotinic acid, cyclohexylamine hydrochloride, 2-chloroethyl-morpholine hydrochloride, diethylamine hydrochloride, triethylamine hydrobromide and aniline hydrochloride. The amount of activating agent present in the flux composition should not normally exceed 20% by weight of the total composition.

Since esters of polyhydric alcohols are generally wax-like or soft, or tend to take some time to harden into a resinous condition after being heated to soldering temperatures and allowed to cool, there may be incorporated in the flux composition, if required, a flux residue hardening agent (c) which itself may be an ester, for example sucrose benzoate, or an abietic acid derivative such as a polymerized rosin, or an ester of a modified abietic acid, e.g., a pentaerythritol ester of a maleated rosin. Such flux residue hardening agents should have an elevated melting point, i.e., a melting point of at least 100° C., preferably a melting point in the range from 100° to 200° C. The amount of hardening agent present in the flux composition should not normally exceed 20% by weight of the total composition.

In the case where a single additional constituent performs the function of two or more of the constituents (a), (b) and (c) the amount of the said constituent in the flux composition may be cumulative, e.g., when a single constituent performs all three functions, up to 60% by weight of the composition may be constituted by the constituent.

The flux composition of the present invention, when intended for use in the electronics industry, is advantageously associated with a soft solder alloy to form a fluxed solder composition, advantageously a flux-cored solder wire, that is an elongate member of soft solder alloy having a substantially uninterrupted core, or plurality of separate cores, of the flux composition extending longitudinally through the interior of the elongate member. Preferably the flux-cored solder wire will contain at least five separate cores of the flux positioned substantially symmetrically with respect to the longitudinal axis of the wire, as in the case of the rosin-cored solder wire sold by Multicore Solders Limited in the United Kingdom and abroad under the label Trade Mark "ERSIN Multicore 5-Core Solder." The flux-cored solder wire can be made by extruding the solder alloy so as to form an elongate wire whilst simultaneously introducing the flux cores. It will be appreciated that for manufacturing a flux-cored solder wire by the foregoing method, the flux composition of the present invention should generally comprise an ester of a polyhydric alcohol having a melting point which is lower than that of the soft solder alloy from which the solder wire is formed, so that the flux composition can be introduced in a molten state into the solder alloy. Following the incorporation of the flux cores into the solder wire, the diameter of the extruded wire may be reduced by, for example, rolling or drawing.

Instead of a flux-cored solder wire, the fluxed solder composition may be in the form of a solder tape or solder preforms, such as for example washers, rings, pellets or discs, which may be punched from solder tape.

The soft solder alloy employed in the aforementioned fluxed solder compositions may be a tin/lead alloy containing at least 1% by weight of tin with the balance being lead. For example the alloy may be a 60/40 tin/-lead alloy. If desired, the alloy may also contain minor proportions of one or more other metals, for example, up to 7% antimony, up to 3% copper, up to 20% cadmium or up to 10% silver, apart from any incidental elements and/or impurities.

The following Examples illustrate flux compositions in accordance with the invention which are in solid form.

EXAMPLE 1

A solid flux composition was prepared by homogeneously mixing at an elevated temperature the following constituents:

| | % by weight |
|---|---|
| Pentaerythritol tetrabenzoate | 92 |
| Adipic acid | 1.5 |
| Nicotinic acid | 1.5 |

-continued

| | % by weight |
|---|---|
| Sucrose benzoate | 5 |

EXAMPLE 2

A solid flux composition was prepared by homogeneously mixing at an elevated temperature the following constituents:

| | % by weight |
|---|---|
| Pentaerythritol tetrabenzoate | 92 |
| Adipic acid | 1.5 |
| 2-Chloroethyl-morpholine hydrochloride | 1.5 |
| Polymerized rosin | 5 |

EXAMPLE 3

A solid flux composition was prepared from the following constituents:

| | % by weight |
|---|---|
| Trimethylolethane tribenzoate | 80 |
| Benzoic acid | 3 |
| Cyclohexylamine hydrochloride | 2 |
| Dimerized rosin | 15 |

The tribenzoate ester and dimerized rosin were melted together at 160° C. The mixture was then allowed to cool to 120° C. and the benzoic acid and cyclohexylamine hydrochloride were then added. The temperature was raised slowly with stirring to 150° C. until a clear solution was obtained. This was then allowed to cool to room temperature to obtain the required flux composition.

EXAMPLE 4

A solid flux composition was prepared from the following constituents in a manner analogous to that described in Example 3:

| | % by weight |
|---|---|
| Pentaerythritol tetrabenzoate | 80 |
| Trimethylolethane tribenzoate | 5 |
| Sebacic acid | 5 |
| Polymerized rosin | 10 |

EXAMPLE 5

A solid flux composition was prepared from the following constituents in a manner analogous to that described in Example 3:

| | % by weight |
|---|---|
| Pentaerythritol tetabenzoate | 90 |
| Adipic acid | 3 |
| 2-Chloroethyl-morpholine hydrochloride | 2 |
| Pentaerythritol ester of a maleated rosin | 5 |

A soft solder alloy consisting of 60 weight % tin and 40 weight % lead was extruded in the form of an elongate wire having five symmetrically positioned cylindrical cavities extending therethrough into which was simultaneously introduced the above-mentioned flux composition in a molten state to form a five flux-cored solder wire, the diameter of which was then reduced by drawing. The resulting wire was then wound on to a suitably sized reel.

The flux-cored solder wire produced in the foregoing manner was then used with a soldering iron at 280° C. to solder electrical contacts. Virtually no fumes were produced during the soldering operation, in contrast to a similar rosin-cored solder wire which when used under the same conditions did produce a substantial amount of fumes.

In the production of printed circuit assemblies used in, for example, electronic equipment, a typical conventional system involves producing a copper circuit conductor pattern on a copper coated plastics laminate board by applying an etch resist, generally by screen printing, to the areas where copper conductors are desired, then etching with, for example, a ferric chloride solution the uncoated copper from the board, removing the etch resist from the board, applying generally by screen printing a solder resist to the areas of the printed circuit board which do not subsequently require the application of solder thereto, and then, if as is usually the case, the board is to be stored prior to the mounting thereon of the required components, applying a protective coating to the board, which coating can be either a tin/lead solder coating or a chemical preservative lacquer which does not require removal before fluxing and soldering. Thereafter the required components are mounted on the printed circuit board by passing the lead wires from the components through holes made in the board and joining them to the copper printed circuit conductors by soldering. The soldering may be effected by hand, for example by the use of a soldering iron and a flux-cored solder wire, or automatically by applying first a liquid flow, for example by brushing, dipping onto the surface of a bath of flux, spraying, rolling on, wave fluxing, i.e., by passing over a standing wave of liquid flux, or foam fluxing, i.e., by passing over a standing wave of foamed flux, and then applying to the fluxed printed circuit assembly so formed a solder, for example by dip, drag, weir or cascade soldering or by wave soldering, i.e., passing over a standing wave of molten solder. To ensure reliability of the soldered joints produced in this manner it is normal for the component lead wires to be coated with a tin-lead solder alloy during manufacture of the components. Finally flux residues resulting from the soldering step are generally removed and a protective coating is often applied to the completed printed circuit assembly by brush, dip or spray methods, to protect the assembly from subsequent deterioration arising, for example, from use in a corrosive atmosphere.

Flux compositions in accordance with the present invention can be prepared in the form of a liquid, by dissolving the constituents in an organic solvent, the choice of which will depend on the desired viscosity and rate of drying of the liquid flux compositions. Such liquid flux compositions of the invention can be used to advantage in the production of printed circuit assemblies, since they enable the normal system as described above to be simplified and hence make it possible to reduce the production costs of the printed circuit assemblies. Thus liquid flux compositions in accordance with the invention, when applied to a clean copper coated plastics laminate board, for example by a screen printing technique, may act as an etch resist in the subsequent etching step and may be retained on the printed circuit board as a protective coating for the copper circuit conductor pattern produced in the etching step, so enabling the boards to be stored ready for eventual use in soldering processes. When required for use, the printed circuit boards can have the required components mounted thereon by insertion of the lead wires through holes made in the board after the etching step and joining them to the printed circuit conductors by application of a solder, without the necessity of a previous separate further application of flux to the printed circuit board, provided that the component lead wires are in a solderable condition. The flux residues resulting from the soldering step do not normally have to be removed and may act as a final protective coating.

It will be readily appreciated from the foregoing that, compared with the conventional method of producing printed circuit assemblies as previously described, the use of liquid flux compositions in accordance with the invention can greatly simplify the production of such assemblies and hence obviate the necessity of using large, complex and expensive equipment in several of the production steps and may also avoid the use of flammable liquid flux on the soldering assembly line, as flux application can be confined to prior board or component production elsewhere. However, if desired, the liquid flow compositions of the invention may be employed in place of known liquid fluxes in a conventional production line.

The liquid flux compositions of the invention may be prepared, as previously mentioned, by dissolving the constituents in a suitable organic solvent, or a mixture of such solvents. Suitable solvents may be chosen from ketones, for example methyl isobutyl ketone and acetone, alcohols, for example isopropanol, and aromatic solvents, for example toluene and xylene.

The flux compositions of the invention, when in liquid form, preferably contain at least 40%, advantageously at least 50%, by weight, based on the solids content of the compositions, of the ester of a polyhydric alcohol, whereas when in solid form, they preferably contain at least 80%, advantageously at least 90%, by weight, based on the total composition, of the said ester.

The following Examples illustrate liquid flux compositions in accordance with the invention.

EXAMPLE 6

A flux composition in liquid form was prepared from the following:

| | % by weight |
|---|---|
| Pentaerythritol tetrabenzoate | 15 |
| Dimerized rosin | 4 |
| 2-Chloroethylmorpholine HCl | 1 |
| Methyl isobutyl ketone | 80 |

EXAMPLE 7

A flux composition in liquid form was prepared from the following:

| | % by weight |
|---|---|
| Trimethylolethane tribenzoate | 12 |
| Polymerized rosin | 6 |
| Adipic acid | 2 |
| Methyl isobutyl ketone | 40 |

-continued

| | % by weight |
|---|---|
| Acetone | 40 |

EXAMPLE 8

A flux composition in liquid form was prepared from the following:

| | % by weight |
|---|---|
| Pentaerythritol tetrabenzoate | 15 |
| Cyclohexylamine hydrochloride | 1 |
| Pentaerythritol ester of a maleated rosin | 5 |
| Toluene | 58 |
| Acetone | 21 |

EXAMPLE 9

A flux composition in liquid form was prepared from the following:

| | % by weight |
|---|---|
| Pentaerythritol tetrabenzoate | 10 |
| Adipic acid | 1 |
| Pentaerythritol ester of a malested rosin | 10 |
| Toluene | 58 |
| Acetone | 21 |

The following Examples illustrate the use of liquid flux compositions of the present invention in the manufacture of printed circuits.

EXAMPLE 10

The liquid flux composition described in the foregoing Example 6 was applied by brush to a clean copper coated plastics laminate board so as to form thereon a pattern in which copper circuit conductors were required to be formed. The resulting board was allowed to dry at room temperature for about 15 minutes and was then immersed in a ferric chloride etch solution from which it was removed after about 15 minutes. The etch solution had removed all the exposed copper coating, leaving the required copper pattern coated by the flux composition which had acted as an etch resist. The board was then washed in running water at room temperature and dried. After artificial ageing in humid conditions, the board was dried and inspected, whereupon, it was still found to have a clear flux composition coating over the copper conductor pattern. The board was then passed in a conventional manner over a standing wave of molten solder without any further prior application of either liquid flux or solvent. This operation was effected on a conventional wave soldering machine with the pre-heating stage before the soldering stage set at 90° C., but with the liquid flux application stage switched off. The solder employed in the soldering stage was a 60/40 tin/lead alloy, which was used at a temperature of 250° C. After the board had passed over the solder wave, it was inspected and found to have soldered the copper conductor pattern completely with an even uniform fused solder coating.

EXAMPLE 11

The solvent content of the liquid flux composition described in the foregoing Example 6 was adjusted so that the composition could be screen printed on to a copper plastics laminate board. The composition was then applied by screen printing onto a clean copper coated plastics laminate board to form a pattern in which copper circuit conductors were required to be formed. The board was then etched, washed and dried as described in Example 10, after which holes were punched in the board in the locations where component leads were subsequently to be passed through the board. Thereafter electronic components having leads coated with the same flux composition were mounted on the uncoated side of the board by passing the leads through the respective punched holes to the copper patterned side of the board and the resulting assembly was passed through the pre-heating stage and then the soldering stage of a conventional wave soldering machine in the manner described in Example 10. The resulting completed printed circuit assembly had perfectly soldered joints.

As mentioned above in connection with the conventional procedure for producing printed circuit assemblies, the component lead wires are generally coated with a solder prior to the mounting of the components on the printed circuit board. It has been found that liquid flux compositions of the invention can likewise be used as a protective coating for lead wires for electronics components and as such can be considered as an alternative to solder.

A further use to which the flux composition of the present invention may be put is as a cover for a solder bath. Solder baths commonly operating at temperatures around 260° C., such as those employed in the soldering of electronics components to a printed circuit board as previously described, are normally provided with an anti-oxidant cover, which is generally a hydrocarbon oil. However such oils are disadvantageous in that they are subject to progressive and rapid oxidation resulting in short life of the protection which they afford. Flux compositions in accordance with the invention can, however, be used as an anti-oxidant cover for a relatively long period and have the added advantage that they can act as a flux during the dip soldering of components in a solder bath having such a protective cover and will not contaminate previously flux-coated components, especially if a similar flux composition were used to flux-coat the components.

The following Examples illustrate flux compositions in accordance with the present invention suitable for use as a combined anti-oxidant cover and flux for solder baths.

EXAMPLE 12

A flux composition was produced from the following constituents:

| | % by weight |
|---|---|
| Pentaerythritol tetrabenzoate | 95 |
| Dimerized linoleic acid | 5 |

EXAMPLE 13

A flux composition was produced from the following constituents:

| | % by weight |
|---|---|
| Trimethylolethane tribenzoate | 90 |
| Dimerized rosin | 10 |

What is claimed is:

1. A flux composition, comprising, as essential constituents:

(1) at least one ester derived from a polyhydric alcohol and at least one saturated or unsaturated fatty acid or *monocarboxylic* mononuclear aromatic acid, *said ester having a molecular weight of at least 300*; and (2) at least one additional constituent selected from:

(a) organic acids which are substantially soluble in said ester of a polyhydric alcohol when in a molten condition;

(b) flux activating agents; and (c) flux residue hardening agents, said ester being present in an amount of at least 25% by weight based on the total weight of constituents (1) and (2).

2. A composition as claimed in claim 1 in the form of a solid, the composition containing at least 80% by weight, based on the total composition, of said ester.

3. A composition as claimed in claim 1 in the form of a liquid, comprising constituents (1) and (2) dissolved in an organic solvent, the liquid composition containing at least 40% by weight of said ester (1), based on the total weight of constituents (1) and (2).

4. A composition as claimed in claim 1, wherein said constituent (1) is an ester having a molecular weight in the range from 300 to 3000 and which is solid at room temperature.

5. A composition as claimed in claim 1, wherein said constituent (1) is an ester derived from a polyhydric alcohol containing from 2 to 8 hydroxyl groups.

6. A composition as claimed in claim 5, wherein said ester is pentaerythritol tetrabenzoate.

7. A composition as claimed in claim 1, wherein said organic acid (a) is present in an amount not exceeding 20% by weight of the total composition.

8. A composition as claimed in claim 1, wherein said flux activating agent (b) is present in an amount not exceeding 20% by weight of the total composition.

9. A composition as claimed in claim 1, wherein said flux residue hardening agent is present in an amount not exceeding 20% by weight of the total composition.

10. A fluxed solder composition for use in soft soldering, the composition comprising in association a soft solder alloy and a flux composition as claimed in claim 1.

11. A method of producing a printed circuit board, which comprises the steps of:

(a) applying to a copper coated plastics laminate board a flux composition as claimed in claim 3 so as to form thereon a pattern in which copper circuit conductors are required to be formed;

(b) subjecting the resulting board to the action of an etch solution so as to remove all the copper coating in those areas outside the patterned areas; and (c) washing and thereafter drying the resulting etched board bearing the required copper circuit conductors still having a coating of said flux composition.

12. A method of producing a printed circuit assembly, which comprises the steps of:

(a) applying to a copper coated plastics laminate board a flux composition as claimed in claim 3 so as to form thereon a pattern in which copper circuit conductors are required to be formed;

(b) subjecting the resulting board to the action of an etch solution so as to remove all the copper coating in those areas outside the patterned areas;

(c) washing and thereafter drying the resulting etched board bearing the required copper circuit conductors still having a coating of said flux composition;

(d) mounting on the printed circuit board so formed a plurality of electronic components by passing the component lead wires through holes formed in the board; and (e) thereafter joining the lead wires to the appropriate copper circuit conductors by soldering with a soft solder alloy without a separate application of flux.

13. A flux composition in accordance with claim 1, wherein said aromatic acid is benzoic acid.

* * * * *